United States Patent
Tamura et al.

(10) Patent No.: US 8,333,869 B2
(45) Date of Patent: Dec. 18, 2012

(54) STRIPPING METHOD AND STRIPPING SOLUTION

(75) Inventors: Koki Tamura, Kawasaki (JP); Takahiro Asai, Kawasaki (JP); Atsushi Kubo, Kawasaki (JP); Hirofumi Imai, Kawasaki (JP); Takahiro Yoshioka, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 25 days.

(21) Appl. No.: 13/077,481

(22) Filed: Mar. 31, 2011

(65) Prior Publication Data

US 2011/0240231 A1    Oct. 6, 2011

(30) Foreign Application Priority Data

Apr. 2, 2010   (JP) ................................. 2010-086425

(51) Int. Cl.
*B32B 38/10* (2006.01)
(52) U.S. Cl. ........ 156/704; 156/703; 156/750; 156/930; 156/941

(58) Field of Classification Search .................. 156/703, 156/704, 750, 930, 941
See application file for complete search history.

(56) References Cited

U.S. PATENT DOCUMENTS

| | | | | |
|---|---|---|---|---|
| 3,335,088 A | * | 8/1967 | Mandell, Jr. | 134/3 |
| 2005/0173064 A1 | * | 8/2005 | Miyanari | 156/344 |
| 2009/0250168 A1 | * | 10/2009 | Sato et al. | 156/344 |

FOREIGN PATENT DOCUMENTS

JP    2008-94957 A    4/2008

* cited by examiner

*Primary Examiner* — Mark A Osele
*Assistant Examiner* — Nickolas Harm
(74) *Attorney, Agent, or Firm* — Knobbe Martens Olson & Bear LLP

(57) ABSTRACT

A method for stripping a wafer from a supporting plate to which the wafer is adhered via an adhesive agent, wherein the supporting plate has a through hole penetrating the supporting plate in a thickness direction thereof, the method including dissolving the adhesive agent with a stripping solution by contacting the stripping solution with the adhesive agent via the through hole. The adhesive agent has a hydrocarbon resin as a viscous component, and the stripping solution is a hydrocarbon-based solvent having a viscosity of 1.3 mPa·s or less and a dissolving rate of 30 nm/sec or greater to dissolve the adhesive agent.

7 Claims, No Drawings

1

STRIPPING METHOD AND STRIPPING SOLUTION

RELATED APPLICATIONS

This application claims priority under 35 U.S.C. §119(a)-(d) to Japanese Patent Application No. 2010-086425, filed Apr. 2, 2010, the entire contents of which are hereby incorporated by reference.

FIELD OF THE INVENTION

The present invention relates to a stripping method for stripping from a supporting plate a substrate to which the supporting plate is adhered, and to a stripping solution for use in the stripping method.

BACKGROUND OF THE INVENTION

As devices such as mobile phone, digital AV apparatuses, IC cards etc. have been improved to have higher performance, semiconductor silicon chips (hereinafter, refer to as chips) to be mounted on the devices have to be smaller and thinner in order to greatly increase a number of chips mounted in packages of the devices. To greatly increase a number of chips mounted in the package, the chips should have a thin thickness in a range of 25 to 150 μm.

However, semiconductor wafers (hereinafter, refer to as wafers) to be substrates of the chips is weakened in strength when the wafers are polished to a thin thickness. The thin wafers with weak strength are easy to be cracked or curved. Moreover, the thin wafers with weak strength are difficult to transport by automatic transportation. This requires manual transportation, and thereby tedious handling.

To deal with this problem, a wafer support system has been developed to reinforce the strength of the wafers by adhering a plate (called a supporting plate, and generally made from glass or rigid plastic) to the wafers before polishing. The wafer support system prevents cracking and curving of the wafer. The wafer support system, which reinforces the strength of the wafers, allows automatic transportation of the thin semiconductor wafers.

The wafers and supports are adhered with each other via an adhesive tape, thermoplastic resin, an adhesive, or the like. After a wafer adhered with the supporting plate is thinned, the wafer is stripped off from the supporting plate before dicing. For example, in case where the wafer and the supporting plate are adhered with each other via an adhesive, the adhesive is dissolved so as to strip the wafer off from the supporting plate.

Conventionally, the dissolving the adhesive to strip the wafer from the supporting plate is time-consuming, for example, in permeating a solvent into the adhesive and in dissolving the adhesive. As a result, the stripping of the supporting plate from the wafer has been a long-time process. Patent Literature 1 discloses a method for using an adhesive allowing easy stripping so as to solve this problem.

In Patent Literature 1, it is described that works are adhered with each other via an adhesive including a first adhesive layer and a second adhesive layer on the first adhesive layer, the first adhesive layer including a first adhesive material in which thermally-soluble microcapsules are dispersed, the thermally-soluble microcapsules holding therein a releasing agent for reducing adhesiveness of the first adhesive material, and the second adhesive layer including a second adhesive material in which thermally expandable particles are dispersed.

Patent Literature 1 describes that, for the works adhered with each other via the adhesive, the stripping is carried out by heating the adhesive. The heating releases the releasing agent from the microcapsules into the first adhesive layer, and expands the thermally expandable particle. The expanding applies a pushing force to cause a crack between the first and second adhesive layers. As a result, the stripping can be carried out without leaving residuals of the adhesive on the works.

CITATION LIST

Patent Literatures

Patent Literature 1

Japanese Patent Application Publication, Tokukai, No. 2008-94957 (Publication Date: Apr. 24, 2008)

SUMMARY OF THE INVENTION

Technical Problem

In stripping a thin wafer from a supporting plate, it is necessary to be careful not to damage the thin wafer. In the method described in Patent Literature 1, however, the heating and the pushing force caused by the thermal expanding of the thermally expandable particles would possibly damage the thin wafer. Furthermore, the method described in Patent Literature 1 has further drawbacks such as wafer contamination with the releasing agent, and low adhesiveness caused because the thermal expandable particles are included in the second adhesive material. Therefore, there is a demand for a novel stripping method and a novel stripping solution, each of which allows easy stripping of the supporting plate from the wafer in shorter time without damaging or contaminating the wafer.

The present invention is accomplished in view of the aforementioned problem, and an object of the present invention is to provide a stripping method and a stripping solution, each of which allows easy stripping of the wafer from the supporting plate in shorter time.

Solution to Problem

In order to attain the object, a stripping method according to the present invention is a method for stripping a wafer from a supporting plate to which the wafer is adhered via an adhesive agent, and which supporting plate has a through hole penetrating the supporting plate in a thickness direction of the supporting plate, the method comprising: dissolving the adhesive agent with a stripping solution, by contacting the stripping solution to the adhesive agent via the through hole, the adhesive agent having a hydrocarbon resin as a viscous component, and the stripping solution being a hydrocarbon-based solvent having a viscosity of 1.3 mPa·s or less and a dissolving rate of 30 nm/sec or greater to dissolve the adhesive agent.

Moreover, in order to attain the object, a stripping solution is a stripping solution for dissolving an adhesive agent adhering a supporting plate and a substrate together, wherein: the stripping solution has a viscosity of 1.3 mPa·s or less and a dissolving rate of 30 nm/sec or greater to dissolve the adhesive agent, and made from one or more hydrocarbon compounds.

Advantageous Effects of the Invention

As described above, the stripping method according to the present invention is arranged such that the stripping solution is a hydrocarbon-based solvent having a viscosity of 1.3 mPa·s or less and a dissolving rate of 30 nm/sec or greater to dissolve the adhesive agent. With this arrangement, a time required to dissolve the adhesive agent adhering the substrate and the supporting plate is shortened. As a result, a time required to strip the substrate and the supporting plate can be shortened.

Moreover, the stripping solution according to the present invention is arranged such that the stripping solution has a viscosity of 1.3 mPa·s or less and a dissolving rate of 30 nm/sec or greater to dissolve the adhesive agent, and made from one or more hydrocarbon compounds. By using such a stripping solution in order to strip the substrate from the supporting plate, the time required to dissolve the adhesive agent adhering the substrate and the supporting plate is shortened. As a result, the time required to strip the substrate and the supporting plate can be shortened.

DETAILED DESCRIPTION OF THE PREFERRED EMBODIMENTS

One embodiment of the present invention is explained below.

A stripping method of the present invention is not limited to a particular usage, provided that the method is used to strip a substrate from a supporting plate to which the substrate is adhered via an adhesive agent. The present embodiment describes the stripping method of the present invention by explaining one exemplary usage in which a wafer (substrate) is stripped from a supporting plate (supporting plate) to which the wafer is temporarily adhered via an adhesive agent for the sake of a wafer support system.

In this Description, what is meant by the term "supporting plate" is a board used for temporally supporting a semiconductor wafer by being adhered to the semiconductor wafer before polishing, so that the semiconductor wafer will not be cracked or curved as a result of the polishing.

The inventors of the present invention made a diligent study on how to shorten a time (stripping time) required to strip the supporting plate from the wafer by dissolving the adhesive agent. As a result, the inventors of the present invention found that permeability of the stripping solution in the adhesive agent and dissolving rate of the stripping solution to dissolve the adhesive agent are both important for dissolving the adhesive agent promptly with the stripping solution supplied via a through hole of the supporting plate. Further, the inventors of the present invention found that for achieving a greater permeability of the stripping solution in the adhesive agent, viscosity of the stripping solution is an important factor. The present invention was accomplished based on these findings.

The stripping method according to the present invention is a method for stripping a wafer from a supporting plate to which the wafer is adhered via an adhesive agent, and which supporting plate has a through hole penetrating the supporting plate in a thickness direction of the supporting plate, the method comprising: dissolving the adhesive agent with a stripping solution, by contacting the stripping solution to the adhesive agent via the through hole, the adhesive agent having a hydrocarbon resin as a viscous component, and the stripping solution being a hydrocarbon-based solvent having a viscosity of 1.3 mPa·s or less and a dissolving rate of 30 nm/sec or greater to dissolve the adhesive agent. In the Description, the wording "stripping the wafer from the supporting plate" means to detach the wafer the supporting plate from each other by stripping, and may be replaced by a wording "stripping the supporting plate from the wafer" or a wording "stripping the wafer and the supporting plate from each other".

[Stripping Solution]

The stripping solution in the stripping method of the present invention is for use in dissolving the adhesive agent adhering the supporting plate and the wafer together.

The stripping solution has a hydrocarbon-based solvent having a viscosity of 1.3 mPa·s or less, preferably of 1.1 mPa·s or less, and more preferably of 0.5 mPa·s or less. In this Description, the "viscosity" is measured by capillary viscometer VMC-252 (made by Rigo Co., Ltd.) to measure a speed (time period) at (in) which 15 ml of a sample sampled into a Cannon-Fenske viscometer tube immersed in a 25° C. thermostatic bath takes to pass through the narrow tube by the sample's own weight. The viscosity of the hydrocarbon solvent can be 1.3 mPa·s or less without a particular lower limit. For example, the stripping solution may be a hydrocarbon solvent of 0.3 mPa·s or greater in viscosity. With a viscosity of 1.3 mPa·s or less, the hydrocarbon-based solvent, that is, the stripping solution supplied through the through hole of the supporting plate can have a greater permeability into a boundary between the supporting plate and a layer of the adhesive agent (hereinafter, referred to as an adhesive layer), and a greater permeability into the adhesive agent. As a result, the adhesive agent can be dissolved more promptly, thereby making it possible to strip the supporting plate and the wafer in a shorter time.

The hydrocarbon-based solvent serving as the stripping solution may be made from a hydrocarbon compound, or a mixture of hydrocarbon compounds. In practice, the stripping solution may be a hydrocarbon agent in which a non-hydrocarbon component (such as impurities) is also contained in addition to the hydrocarbon compound(s), provided the non-hydrocarbon component does not adversely affects the characteristic effect of the present invention. Non-hydrocarbon component content is not particularly limited, provided the non-hydrocarbon component does not adversely affects the characteristic effect of the present invention. However, in order to sufficiently achieve the effect of shortening the stripping time, it is preferable that hydrocarbon component content is 80 wt % or greater in the stripping solution, and it is more preferable that hydrocarbon component content is 90 wt % or greater in the stripping solution.

In case the hydrocarbon-based solvent is made from a mixture of hydrocarbon compounds, the mixture of hydrocarbon compounds may be prepared or obtained as a mixture, or may be a mixture made by mixing individual hydrocarbon compounds prepared or obtained individually.

The hydrocarbon compound(s) constituting the hydrocarbon-based solvent may be straight-chained, branched, or cyclic. Examples of the hydrocarbon compound encompass terpene-based hydrocarbons, naphthene-based hydrocarbons, aliphatic hydrocarbons, isoparaffin-based hydrocarbons, and the like. Examples of the hydrocarbon-based solvent made from one type of hydrocarbon compound encompass p-menthane, d-limonene, cyclohexane, hexane, octane, nonane, and the like. Examples of the hydrocarbon-based solvent made from a mixture of hydrocarbon compounds prepared or obtained as a mixture encompass dipentene and the like. Dipentene is an isomeric mixture of p-methadienes, which have their double bonds at different positions. Examples of commercially-available hydrocarbon-based solvent obtained as a mixture of hydrocarbon compounds encompass "Dipentene T" (product name; an isomeric mixture of p-menthadiene, made by Nippon terpene chemicals Inc.), "EXXSOL" (product name; a mixture of naphthene-based hydrocarbons made by Exxon Mobile Corp.), "SWA Clean" (product name; a mixture of naphthene-based hydrocarbons made by Maruzen Petrochemical), and "PEGASOL" (product name; a mixture of aliphatic hydrocarbons made by Exxon Mobile Corp.), etc.

In case the stripping solution is a mixture of hydrocarbon-based solvents prepared or obtained independently, the mixture of the hydrocarbon-based solvents should be within the above-mentioned viscosity range. For example, if the mixture of hydrocarbon-based solvents finally has a viscosity within the viscosity range, the hydrocarbon-based solvents before mixing may include a hydrocarbon-based solvent whose viscosity is greater than 1.3 mPa·s. That is, as long as the finally-obtained mixture has a viscosity in the viscosity range, the stripping solution may be a hydrocarbon-based solvent including turpentine oil (viscosity: 1.31 mPa·s) or the like. In case where the stripping solution is a mixture of hydrocarbon-based solvents, it is more preferable that at least one of the hydrocarbon-based solvents has a viscosity of 0.5 mPa·s or less. By arranging such that the stripping solution is a mixture of hydrocarbon-based solvents, at least one of which has a viscosity of 0.5 mPa·s or less, the viscosity of the mixture can be readily reduced, thereby obtaining the stripping solution for use in the stripping method of the present invention. For example, a hydrocarbon-based solvent, use of which is desirable because of safety, environmental reasons, cost, etc., may have a viscosity greater than 1.3 mPa·s. In this case, the stripping solution for use in the stripping method according to the present invention may be prepared by mixing this hydrocarbon-based solvent of greater than 1.3 mPa·s in viscosity, with a hydrocarbon-based solvent of 0.5 mPa·s or less in viscosity.

In the stripping method according to the present invention, the dissolving rate of the stripping solution to dissolve the adhesive agent adhering the wafer and the supporting plate together is 30 nm/sec or greater, more preferably 50 nm/sec or greater. The dissolving rate of the stripping solution depends on the adhesive agent to dissolve. The dissolving rate of the stripping solution to an adhesive agent can be easily measured in advance by a conventionally known method. There is no particular upper limit for the dissolving rate of the stripping solution. For example, the stripping solution may have a dissolving rate of 1,000 nm/sec or slower. If the hydrocarbon-based solvent as the stripping solution was a mixture of hydrocarbon compounds, the mixture should have a dissolving rate of 30 nm/sec or greater. Therefore, for example, in case the stripping solution is a mixture of hydrocarbon-based solvents, the hydrocarbon-based solvents may includes a hydrocarbon-based solvent having a dissolving rate slower than 30 nm/sec to dissolve the adhesive agent, provided that the finally-obtained mixture has a dissolving rate of 30 nm/sec or greater. The use of a stripping solution with a viscosity of 1.3 mPa·s or less and a dissolving rate of 30 nm/sec to the adhesive agent makes it possible to shorten the stripping time.

In case where the stripping solution is a mixture of hydrocarbon-based solvents, there is no particular limit as to combination of the hydrocarbon-based solvents. However, it is preferable that the combination includes a hydrocarbon-based solvent capable of giving a smaller viscosity to the stripping solution. For example, it is preferable that the combination includes a hydrocarbon-based solvent having a viscosity of 0.5 mPa·s or less. Moreover, in this case, it is more preferable that all of the hydrocarbon-based solvents in the combination have viscosities of 1.3 mPa·s or less, and dissolving rate of 30 nm/sec or greater to dissolve the adhesive agent. Moreover, it is especially preferable that all of the hydrocarbon-based solvents in the combination have viscosities of 1.0 mPa·s or less, and dissolving rate of 30 nm/sec or greater to dissolve the adhesive agent, and at least one of the hydrocarbon-based solvents has a viscosity of 0.5 mPa·s or less.

In case where the stripping solution is a mixture of a hydrocarbon-based solvent having a viscosity of 0.5 mPa·s or less with another hydrocarbon-based solvent in combination, it is possible to further shorten the dissolving time when the another hydrocarbon-based solvent has a greater dissolving rate to the adhesive agent than the hydrocarbon-based solvent having a viscosity of 0.5 mPa·s or less.

In case where the stripping solution is a mixture of a hydrocarbon-based solvent having a viscosity of 0.5 mPa·s or less with another hydrocarbon-based solvent in combination, there is no particular limitation as to a mixture ratio between the hydrocarbon-based solvent and the another hydrocarbon-based solvent. However, for sufficiently enjoying the benefit of using the respective hydrocarbon-based solvents, the hydrocarbon-based solvent having a viscosity of 0.5 mPa·s or less is contained in the mixture preferably by 5 wt % to 95 wt %, more preferably by 25 wt % to 75 wt %, and especially preferably by 45 wt % to 55 wt %.

In addition, the present invention encompass a stripping solution for dissolving an adhesive adhering a supporting plate and wafer together, the stripping solution being made from one or more hydrocarbon compounds, the stripping solution has having a viscosity of 1.3 mPa·s or less and a dissolving rate of 30 nm/sec or greater to dissolve the adhesive agent.

[Adhesive Agent]

The adhesive agent to be dissolved by the stripping solution in the stripping method is an adhesive agent adhering the supporting plate and the wafer together, and contains a hydrocarbon resin as a viscous component.

The hydrocarbon resin may be, but not limited to, a cycloolefin-based resin, terpene-based resin, rosin-based resin, petroleum resin, or the like. The cycloolefin-based resin is a polymer of monomer components including a cycloolefin monomer. More specifically, the cycloolefin-based resin may be an open-ringed (co)polymer of monomer components including a cycloolefin monomer, an addition (co)polymer of monomer components including a cycloolefin monomer, or the like polymer.

The cycloolefin monomer included in the monomer components to produce the cycloolefin-based resin is not limited to a particular type. However, it is preferable that the cycloolefin monomer is a norbornene-based monomer. The norbornene-based monomer is not particularly limited, provided that the monomer has a norbornene ring. Examples of the norbornene-based monomer encompass: two-ring compounds such as norbornene and norbornadiene; three-ring compounds such as dicyclopentadiene and dihydroxypentadiene; four-ring compounds such as tetracyclododecene; five-ring compounds such as cyclopentadiene trimer; seven-ring compounds such as tetracyclopentadiene; these polycyclic compounds substituted with an alkyl (methyl, ethyl, propyl, butyl, etc.) group, with an alkenyl (vinyl etc.) group, with an alkylidene (ethylidene etc.) group, or an aryl (phenyl, tolyl, naphthyl, etc.) group; and the like. More specifically, the norbornene-based monomer may be a norbornene-based monomer being represented by the following general formula (I), and being selected from the group consisting of norbornene and tetracyclododecene, which are substituted or not substituted with an alkyl group.

[Chem. 1]

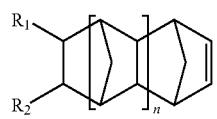

(I)

where $R_1$ and $R_2$ are independently a hydrogen or an alkyl group having 1 of chain length of 1 to 6 carbon atoms, and n is 0 or 1.

The monomer components from which the cycloolefin-based resin is produced may include, in addition to the cycloolefin monomer, another monomer that is copolymerizable with the cycloolefin monomer. The another monomer may be, for example, an olefin monomer represented by the following general formula (II):

[Chem. 2]

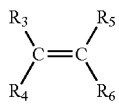

(II)

where $R_3$ to $R_6$ are independently a hydrogen or an alkyl group having 1 of chain length of 1 to 4 carbon atoms.

The olefin monomer may be straight-chained or branched. Examples of the olefin monomer encompass α-olefin such as ethylene, propylene, 1-butene, isobutene, and 1-hexene.

Examples of commercially-available cycloolefin-based resin encompass "TOPAS" (product name, made by Polyplastics Co., Ltd.), "APEL" (product name, made by Mitsui Chemicals Inc.), "ZEONOR" and "ZEONEX" (product names, made by Zeon Corp.), and "ARTON" (product name, made by JSR corp.), etc.

Examples of the terpene-based resin encompass a terpene resin, terpene phenol resin, modified terpene resin, hydrogenated terpene resin, and hydrogenated terpene phenol resin, and the like. Examples of the rosin-based resin encompass rosin, rosin ester, hydrogenated rosin, hydrogenated rosin ester, polymerized rosin, polymerized rosin ester, modified rosin, and the like. Examples of the fossil fuel-based resin encompass aliphatic or aromatic fossil fuel-based resin, hydrogenated fossil fuel-based resin, modified fossil fuel-based resin, alicyclic fossil fuel-based resin, coumarone-indene resin, and the like. Among these, the hydrogenated terpene resin and hydrogenated fossil fuel resin are preferable.

Moreover, the adhesive agent may be a mixture of the cycloolefin-based resin and a resin selected from the group consisting of the terpene-based resin, rosin-based resin, and the fossil fuel-based resin.

The adhesive agent used for adhering the wafer with the supporting plate is a solution of the aforementioned hydrocarbon resin(s) in an organic solvent. The organic solvent can be any organic solvent that can dissolve the hydrocarbon resin(s) therein. For example, the organic solvent may be a hydrocarbon-based solvent, preferably a terpene-based solvent.

[Supporting Plate]

The supporting plate in the present embodiment according to the stripping method of the present invention is for preventing cracking or curving of the wafer. The supporting plate is used in the wafer support system in which the supporting plate is temporally adhered to the wafer via the adhesive agent. The supporting plate has a through hole in its thickness direction. Because of the through hole penetrating the supporting plate in the thickness direction, the stripping solution supplied from outside of the supporting plate can pass the through hole so as to reach an adhesive layer adhering the supporting plate and wafer. In order to achieve much shorter stripping time, it is preferable that a plurality of such through holes are provided to the supporting plate. In this Description, the "thickness direction" is a direction perpendicular to a surface of the supporting plate which surface faces the adhesive layer. The stripping solution starts dissolving the layer of the adhesive layer under the through hole in which the stripping solution contacts the layer of the adhesive layer, whereas the stripping solution also permeates into a boundary between the supporting plate and the adhesive layer, thereby starting to dissolve the adhesive layer not under the through hole, that is, between the through holes. Note that in this description, the wording "dissolving the adhesive agent" may mean dissolving the adhesive agent completely or may mean dissolving the adhesive agent partially.

There is no particular limitation as to intervals of the through holes. However, in order to cause the stripping solution to reach the adhesive layer not under the through holes via the boundary between the supporting plate and the adhesive layer in a shorter time, it is preferable that the intervals between the through holes are 500 μm or less, it is more preferable that the intervals between the through holes are 300 μm or less, and it is especially preferable that the intervals between the through holes are 200 μm or less. Moreover, there is no particular limitation as to a size of the through holes. However, in consideration of strength of the supporting plate and an amount of the stripping solution to be supplied to the adhesive agent, the size of the through holes may be 300 μm in diameter, for example. By using the stripping solution to the wafer adhered with the aforementioned supporting plate, the permeability of the stripping solution to the boundary between the supporting plate and the adhesive layer is improved, thereby shortening the stripping time.

[Stripping Method]

The stripping method according to the present invention is a method for stripping a wafer from a supporting plate to which the wafer is adhered via an adhesive agent, and which supporting plate has a through hole penetrating the supporting plate in a thickness direction of the supporting plate, the method comprising: dissolving the adhesive agent with a stripping solution, by contacting the stripping solution to the adhesive agent via the through hole, the adhesive agent having a hydrocarbon resin as a viscous component, and the stripping solution being a hydrocarbon-based solvent having a viscosity of 1.3 mPa·s or less and a dissolving rate of 30 nm/sec or greater to dissolve the adhesive agent. As long as the stripping method according to the present invention is as above, it is not particularly limited as to the other factors such as specific processes, conditions, and apparatuses to use, etc.

In the step of dissolving the adhesive agent with a stripping solution, by contacting the stripping solution to the adhesive agent via the through hole, a wafer (treatment target) to be treated, that is, a wafer adhered with a supporting plate via an adhesive is prepared. Then, the stripping solution is supplied to the treatment target. The stripping solution thus supplied reaches the adhesive layer via the through hole of the supporting plate. The stripping solution reached the adhesive layer dissolves the adhesive agent located under the through hole. Further, the stripping solution permeates into the adhesive agent from where the adhesive agent is dissolved. In this way, the dissolving the adhesive agent proceeds. The stripping solution reached the adhesive layer via the through hole also permeates into the boundary between the supporting plate and the adhesive layer, so that the adhesive agent dissolves the adhesive layer not under the through hole of the supporting plate, that is, between each through hole. After the adhesive layer is dissolved, the supporting plate is stripped from the wafer by using a jig or the like. The dissolving the adhesive agent may be to dissolve the adhesive layer completely or may be to dissolve the adhesive layer partially to an extent that the supporting plate can be stripped from the wafer. After the supporting plate is stripped from the wafer, it may be arranged such that the adhesive agent remained on a surface of the wafer is washed away.

The stripping method according to the present invention employs the aforementioned stripping solution, thereby achieving a greater permeability of the stripping solution into the boundary between the supporting plate and the adhesive layer. By this, it becomes possible to start the dissolving the adhesive agent not under the through hole earlier, and to provide a greater amount of the stripping solution to the adhesive agent not under the through hole earlier. As a result, the dissolving the adhesive layer can take place more promptly, thereby shortening the stripping time (time required to perform the stripping) compared with the conventional art.

In the following, the embodiment of the present invention is explained in more details via Examples. It should be noted that the present invention is not limited to these Examples, and may be modified variously in details. The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims. Further, all the literatures mentioned herein are incorporated herein by reference.

EXAMPLES

Example 1

Preparation of Adhesive Agent

A cycloolefin copolymer (TOPAS (product name) 8007 made by Polyplastics Co., Ltd., norbornene: ethylene=65:35 (by weight), weight average molecular weight: 98,200, Mw/Mn: 1.69, Glass transition temperature (Tg): 70° C.) prepared by copolymerizing norbornene and ethylene under metallocene catalyst was dissolved in p-menthane, thereby obtaining an adhesive agent having a solid content of 30 wt % as an adhesive agent 1. Moreover, "TOPAS 8007" and a hydrogenated terpene resin ("Clearon (product name) P135", made by Yasuhara Chemical Co., Ltd., weight average molecular weight: 820, softening point: 135° C.) in a ratio of 65/35 (=TOPAS 8007/Clearon P135) were dissolved into p-menthane, thereby obtaining an adhesive agent having a solid content of 30 wt % as an adhesive agent 2.

(Dissolving Rate Measurement)

Onto a silicon wafer cut into a size of 1 cm×2 cm, the adhesive agent 1 or 2 was applied. Then, the adhesive agent 1 or 2 on the silicon wafer was dried at 110° C. for 3 minutes, 150° C. for 3 minutes, and then 200° C. for 3 minutes, thereby obtaining an adhesive layer of a thickness of 25 µm. The silicon wafer on which the adhesive layer was produced was immersed in a stripping solution kept at 23° C., thereby measuring a time (dissolving time T (sec)) required to completely dissolve the adhesive layer. From the dissolving time (T (sec)) and a thickness of the adhesive layer (L (nm)) measured in advance, a dissolving rate (L/T (nm/sec)) was calculated out. As the stripping solution, the followings were used: "Woody River #10" (product name; p-menthane of 96.0% purity, made by Yasuhara chemical Co., Ltd.) "Woody River #8" (product name; d-limonene of 98.5% purity, made by Yasuhara chemical Co., Ltd.), "Turpentine oil" (product name, made by Nippon Terpene Chemicals Inc.), "Pinane" (product name, made by Nippon Terpene Chemicals Inc.), "Dipentene T" (product name, made by Nippon Terpene Chemicals Inc.), "EXXSOL (product name) D40" (made by Exxon Mobile Corp.) "EXXSOL (product name) D80" (made by Exxon Mobile Corp.), "EXXSOL (product name) DSP 80/100" (made by Exxon Mobile Corp.), "EXXSOL (product name) D30" (made by Exxon Mobile Corp.), "PEGASOL (product name) 3040" (made by Exxon Mobile Corp.), "PEGASOL (product name) AN45" (made by Exxon Mobile Corp.), and "SWA Clean" (product name, made by Maruzen Petrochemical). The measurements results for the dissolving rates for the adhesive agent 1 were shown on Table 1, while the measurements results for the dissolving rates for the adhesive agent 2 were shown on Table 2.

(Viscosity Measurement)

Viscosities of carbohydrate-based solvents used as the stripping solution were measured by using capillary viscometer VMC-252 (made by Rigo Co., Ltd.) to measure a speed (time period) at (in) which 15 ml of a sample sampled into a Cannon-Fenske viscometer tube immersed in a 25° C. thermostatic bath takes to pass through the narrow tube by the sample's own weight. The results of the viscosity measurements are also shown on Tables 1 and 2.

(Measurement of Stripping Time)

Onto a silicon wafer cut into a size of 1 cm×2 cm, the adhesive agent 1 or 2 was applied. Then, the adhesive agent 1 or 2 on the silicon wafer was dried at 110° C. for 3 minutes, 150° C. for 3 minutes, and then 200° C. for 3 minutes, thereby obtaining an adhesive layer of a thickness of 25 µm. Next, a supporting plate was adhered on the adhesive agent on the silicon wafer, which supporting plate had a size of 1 cm×2 cm and had through holes of 300 µm in diameter with intervals of 300 µm therebetween. The supporting plate was adhered on the adhesive agent on the silicon wafer in such a way that the supporting plate intersected the silicon wafer. The adhering the supporting plate to the silicon wafer was carried out by applying a pressure of 0.3 kg/cm² for 30 sec or 15 sec under a temperature of 200° C.

The silicon wafer adhered with the supporting plate was completely immersed in the stripping solution kept at 23° C., with the supporting plate facing upward and firmly held with a jig. Measured was a time period (stripping time) from when the silicon wafer adhered with the supporting plate was immersed into the stripping solution, to when the silicon wafer was stripped from the supporting plate by its own weight of the silicon wafer, and begun to fall off from the supporting plate. Table 1 shows the results of the measurement of the stripping times for the cases where the adhering agent 1 was used for the adhesion. Table 2 shows the results of the measurement of the stripping times for the cases where the adhering agent 2 was used for the adhesion. The names of the stripping solutions used are shown on Tables 1 and 2. It is preferable that the stripping time is 60 min or shorter in view of productivity.

TABLE 1

| | Stripping solution | Dissolving Rate (nm/sec) | Viscosity (mPa · s) | Stripping Time (min) |
|---|---|---|---|---|
| Example | p-menthane | 50 | 1.02 | 60 |
| | d-limonene | 91 | 0.86 | 48 |
| | dipentene T | 67 | 1.00 | 59 |
| | SWA Clean | 43 | 0.74 | 55 |
| | PEGASOL 3040 | 41 | 0.86 | 60 |
| | PEGASOL AN45 | 49 | 0.82 | 48 |
| Comparative Example | Turpentine Oil | 56 | 1.31 | 152 |
| | Pinane | 27 | 2.03 | >180 |
| | EXXSOL D40 | 29 | 0.96 | 81 |
| | EXXSOL D80 | 20 | 1.66 | 163 |

TABLE 2

| | Stripping solution | Dissolving Rate (nm/sec) | Viscosity (mPa · s) | Stripping Time (min) |
|---|---|---|---|---|
| Example | p-menthane | 80 | 1.02 | 55 |
| | d-limonene | 150 | 0.86 | 40 |
| | dipentene T | 96 | 1.00 | 49 |
| | EXXSOL D40 | 64 | 0.96 | 55 |
| | SWA Clean | 75 | 0.74 | 44 |
| | PEGASOL 3040 | 46 | 0.86 | 48 |
| | PEGASOL AN45 | 83 | 0.82 | 45 |
| | EXXSOL DSP80/100 | 105 | 0.44 | 25 |
| | EXXSOL D30 | 85 | 0.78 | 50 |
| Comparative Example | Turpentine Oil | 70 | 1.31 | 131 |
| | Pinane | 52 | 2.03 | >180 |
| | EXXSOL D80 | 20 | 1.66 | 163 |

As shown on Tables 1 and 2, the stripping times were 60 min or shorter in case a stripping solution having a dissolving rate of 30 nm/sec or greater to dissolve the adhesive agent, and having a viscosity of 1.30 mPa·s was used to strip the wafer and the supporting plate (such a case are classified as Example on Tables 1 and 2). That is, the stripping time was shortened in Example. On the other hand, the stripping times were longer than 60 min in case a stripping solution not having a dissolving rate of 30 nm/sec or greater to dissolve the adhesive agent, and/or not having a viscosity of 1.30 mPa·s was used to strip the wafer and the supporting plate (such a case are classified as Comparative Example on Tables 1 and 2).

Example 2

Example 2 evaluated cases where the stripping solution was a mixture of two types of hydrocarbon-based solvents. The hydrocarbons used in combination were "EXXSOL (product name) DSP80/100" (made by Exxon Mobil Corp.) and one of "Woody River #10 (product name)" (p-menthane of 96.0 purity made by Yasuhara Chemical Co., Ltd.), "Woody River #8 (product name)" (d-limonene of 98.5 purity made by Yasuhara Chemical Co., Ltd.), and "Turpentine oil" (product name, made by Nippon Terpene Chemicals Inc.). The combinations of the hydrocarbon-based solvents and their mixing ratios are shown on Tables 3 and 4. Mixtures were measured in viscosity, dissolving rates to dissolve the adhesive agent, and stripping time in the same manner as in Example 1. Table 3 shows the measurement results for the adhesive agent 1, while Table 4 shows the measurement results for the adhesive agent 2.

Tables 3 and 4 show that, even if the stripping solution was a mixture of hydrocarbon-based solvents, the stripping time to strip the wafer and the supporting plate was 60 min or shorter as long as the mixture had a dissolving rate of 30 nm/sec or greater to dissolve the adhesive agent, and had a viscosity of 1.30 mPa·s. Moreover, it was shown that, even if a mixture included turpentine oil which is a hydrocarbon-based solvent having a viscosity greater than 1.30 (viscosity: 1.31), the stripping time to strip the wafer and the supporting plate was 60 min or shorter as long as the mixture finally had a viscosity of 1.30 or less.

Further, a stripping solution being a combination of d-limonene having a greater dissolving rate and a smaller viscosity than p-menthane, and EXXSOL DSP80/100 shortened the stripping time compared with a stripping solution being a combination of p-menthane and EXXSOL DSP80/100. Either of these stripping solutions achieved a stripping time of 30 min or shorter.

TABLE 3

| Stripping solution | Mixing Ratio (by weight) | Dissolving Rate (nm/sec) | Viscosity (mPa · s) | Stripping time (min) |
|---|---|---|---|---|
| p-menthane/ EXXSOL DSP80/100 | 90/10 | 59 | 0.92 | 52 |
| p-menthane/ EXXSOL DSP80/100 | 70/30 | 54 | 0.76 | 45 |
| p-menthane/ EXXSOL DSP80/100 | 50/50 | 50 | 0.64 | 42 |
| d-limonene/ EXXSOL DSP80/100 | 90/10 | 88 | 0.77 | 30 |
| d-limonene/ EXXSOL DSP80/100 | 70/30 | 74 | 0.66 | 26 |
| d-limonene/ EXXSOL DSP80/100 | 50/50 | 73 | 0.58 | 25 |
| turpentine oil/ EXXSOL DSP80/100 | 50/50 | 55 | 0.68 | 49 |

TABLE 4

| Stripping solution | Mixing Ratio (by weight) | Dissolving Rate (nm/sec) | Viscosity (mPa · s) | Stripping time (min) |
|---|---|---|---|---|
| p-menthane/ EXXSOL DSP80/100 | 90/10 | 93 | 0.92 | 53 |
| p-menthane/ EXXSOL DSP80/100 | 70/30 | 88 | 0.76 | 43 |
| p-menthane/ EXXSOL DSP80/100 | 50/50 | 81 | 0.64 | 42 |
| d-limonene/ EXXSOL DSP80/100 | 90/10 | 142 | 0.77 | 29 |
| d-limonene/ EXXSOL DSP80/100 | 70/30 | 101 | 0.66 | 28 |
| d-limonene/ EXXSOL DSP80/100 | 50/50 | 97 | 0.58 | 26 |
| turpentine oil/ EXXSOL DSP80/100 | 70/30 | 74 | 0.84 | 59 |
| turpentine oil/ EXXSOL DSP80/100 | 50/50 | 77 | 0.68 | 48 |

INDUSTRIAL APPLICABILITY

According to the stripping method according to the present invention, it is possible to strip a substrate from a support board in a shorter time easily. Thus, the present invention is suitable applicable to production of fine semiconductor devices.

We claim:

1. A method for stripping a wafer from a supporting plate to which the wafer is adhered via an adhesive agent, wherein the supporting plate has a through hole penetrating the supporting plate in a thickness direction thereof, the method comprising:
    dissolving the adhesive agent with a stripping solution by contacting the stripping solution with the adhesive agent via the through hole,
    wherein the adhesive agent comprises a hydrocarbon resin, the stripping solution is one hydrocarbon-based solvent or a mixture of a plurality of hydrocarbon-based solvents, and the stripping solution has a viscosity of 1.3 mPa·s or less and a dissolving rate of 30 nm/sec or greater of the adhesive agent.

2. The method of claim 1, wherein the stripping solution is the one hydrocarbon-based solvent, and
    the one hydrocarbon-based solvent comprises a single hydrocarbon compound.

3. The method of claim 1, wherein the one hydrocarbon-based solvent comprises a mixture of hydrocarbon compounds.

4. The method of claim 1, wherein the stripping solution is the mixture of the plurality of hydrocarbon-based solvents, and
    at least one of the plurality of hydrocarbon-based solvents has a viscosity of 0.5 mPa·s or less.

5. The method of claim 1, wherein the stripping solution is the mixture of the plurality of hydrocarbon-based solvents,
    each of the plurality of hydrocarbon-based solvents has a viscosity of 1.0 mPa·s or less and a dissolving rate of 30 nm/sec or greater of the adhesive agent, and
    at least one of the plurality of hydrocarbon-based solvents has a viscosity of 0.5 mPa·s or less.

6. The method of claim 1, wherein a plurality of the through holes are provided on the supporting plate with intervals of 500 μm or less therebetween.

7. The method of claim 1, wherein the stripping solution is the mixture of the plurality of hydrocarbon-based solvents,
    each of the plurality of hydrocarbon-based solvents has a viscosity of 1.3 mPa·s of less, and a dissolving rate of 30 nm/sec or greater of the adhesive agent, and
    at least one of the plurality of hydrocarbon-based solvents has a viscosity of 0.5 mPa·s or less.

* * * * *